United States Patent
Barr et al.

(10) Patent No.: US 10,403,774 B2
(45) Date of Patent: Sep. 3, 2019

(54) WAVELENGTH-SELECTIVE PHOTOVOLTAIC FOR A DISPLAY OR FOR A DEVICE WITH A DISPLAY

(71) Applicant: UBIQUITOUS ENERGY, INC., Redwood City, CA (US)

(72) Inventors: Miles C. Barr, Redwood City, CA (US); Ryan Salvas, Auburn, AL (US); Bart Anson Howe, Houston, TX (US); Richard Royal Lunt, Williamston, MI (US); Vladimir Bulovic, Lexington, MA (US)

(73) Assignee: UBIQUITOUS ENERGY, INC., Redwood City, CA (US)

( * ) Notice: Subject to any disclaimer, the term of this patent is extended or adjusted under 35 U.S.C. 154(b) by 551 days.

(21) Appl. No.: 14/432,307

(22) PCT Filed: Oct. 1, 2013

(86) PCT No.: PCT/US2013/062911
§ 371 (c)(1),
(2) Date: Mar. 30, 2015

(87) PCT Pub. No.: WO2014/055549
PCT Pub. Date: Apr. 10, 2014

(65) Prior Publication Data
US 2015/0255651 A1 Sep. 10, 2015

Related U.S. Application Data

(60) Provisional application No. 61/708,389, filed on Oct. 1, 2012.

(51) Int. Cl.
*H01L 31/042* (2014.01)
*H01L 31/02* (2006.01)
(Continued)

(52) U.S. Cl.
CPC ........ *H01L 31/042* (2013.01); *G02F 1/13306* (2013.01); *H01L 31/02008* (2013.01);
(Continued)

(58) Field of Classification Search
CPC ............ H01L 31/02168; H01L 31/042; H01L 31/02008; H01L 31/0488; H01L 31/046; H01L 31/0468
See application file for complete search history.

(56) References Cited

U.S. PATENT DOCUMENTS 4,166,919 A * 9/1979 Carlson ............ H01L 31/02168
136/255
5,886,688 A 3/1999 Fifield et al.
(Continued)

FOREIGN PATENT DOCUMENTS

CN 1550848 A 12/2004
JP H04-238231 A 8/1992
(Continued)

OTHER PUBLICATIONS

Office Action dated May 3, 2017, for Chinese Application No. CN201380051588.7.
(Continued)

*Primary Examiner* — Golam Mowla
(74) *Attorney, Agent, or Firm* — Kilpatrick Townsend & Stockton LLP

(57) ABSTRACT

Described herein is an apparatus and method used to provide power or photovoltaic functionality to a display or device containing a display without impacting the visual perception of the display. The wavelength-selective photovoltaic (WPV) element is visibly transparent, in that it absorbs selectively around the visible emission (or reflection) peaks generated by the display. The photovoltaic material is able to cover a portion or the entire surface area of the display,
(Continued)

without substantially blocking or perceptually impacting the emission (or reflection) of content from the display. The incident light that is absorbed by the photovoltaic element is then converted into electrical energy to provide power to the device, for example.

19 Claims, 24 Drawing Sheets

(51) Int. Cl.
  *H01L 31/048* (2014.01)
  *H01L 31/046* (2014.01)
  *G02F 1/133* (2006.01)
  *H01L 31/0216* (2014.01)
  *H01L 31/0468* (2014.01)
(52) U.S. Cl.
  CPC ...... *H01L 31/02168* (2013.01); *H01L 31/046* (2014.12); *H01L 31/0468* (2014.12); *H01L 31/0488* (2013.01); *G02F 2001/13324* (2013.01); *Y02E 10/52* (2013.01)

(56) References Cited

U.S. PATENT DOCUMENTS

| | | |
|---|---|---|
| 6,094,404 A | 7/2000 | Hidai et al. |
| 6,518,944 B1 | 2/2003 | Doane et al. |
| 2009/0103161 A1 | 4/2009 | Kothari et al. |
| 2010/0245731 A1 | 9/2010 | Limeketkai |
| 2012/0154364 A1 | 6/2012 | Chang |

FOREIGN PATENT DOCUMENTS

| | | |
|---|---|---|
| JP | H08-94992 A | 4/1996 |
| JP | 2003167233 A | 6/2003 |
| JP | 2004111876 A | 4/2004 |
| JP | 2009060051 A | 3/2009 |
| JP | 2012032420 A | 2/2012 |
| WO | 97/44707 A2 | 11/1997 |

OTHER PUBLICATIONS

Office Action dated Jun. 28, 2017, for Japanese Application No. JP2015-534818, 5 pages.
CN201380051588.7, "Office Action", dated Dec. 28, 2017, 5 pages.
JP2015-534818, "Office Action", dated Mar. 6, 2018, 11 pages.
JP2015-534818, "Office Action", dated Dec. 21, 2018, 11 pages.

* cited by examiner

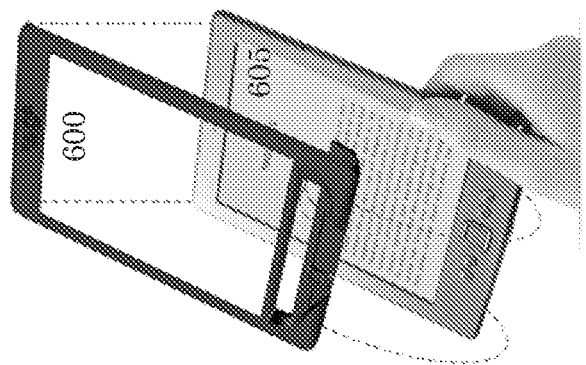
FIGURE 6B
FIGURE 6A

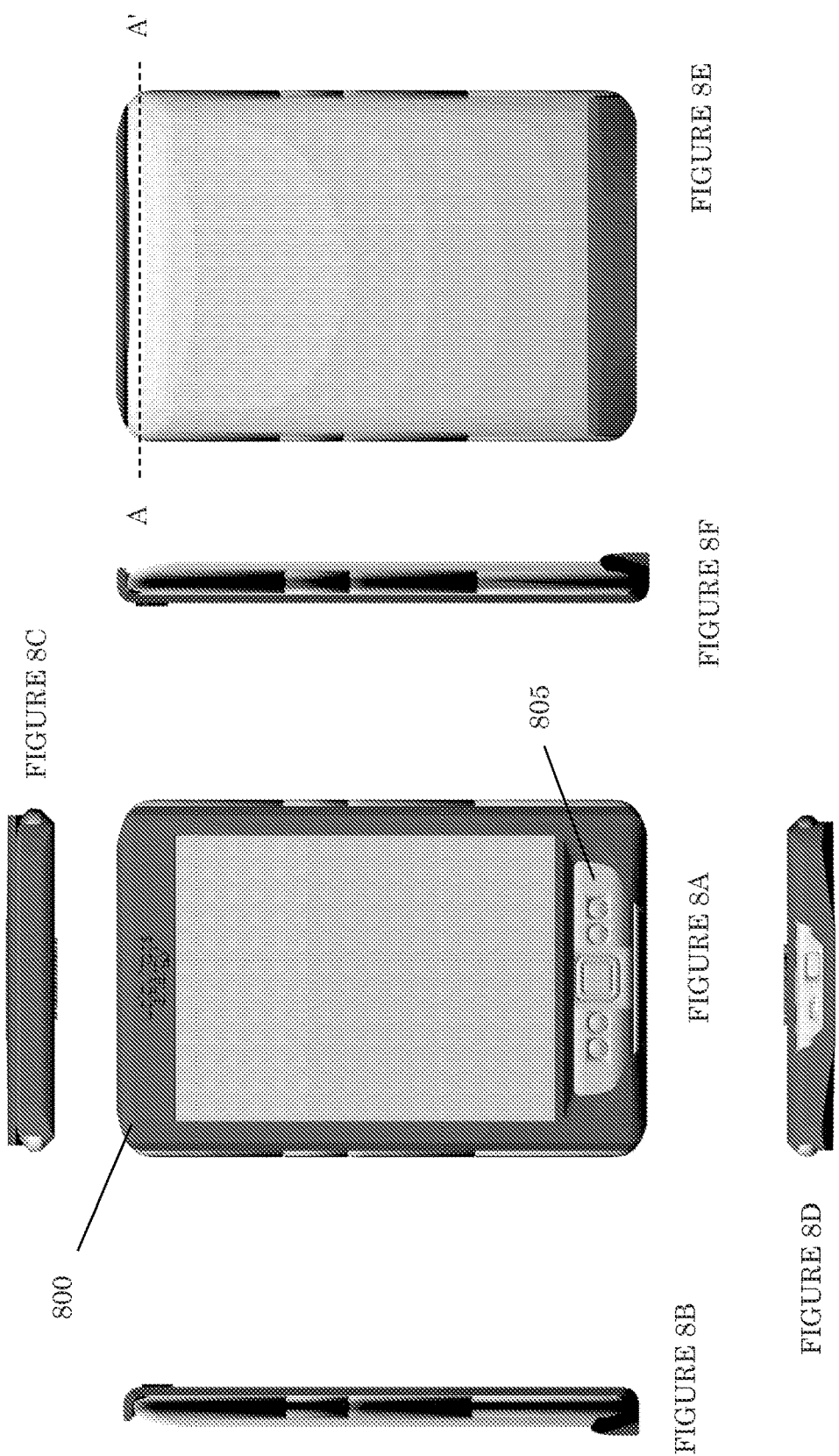

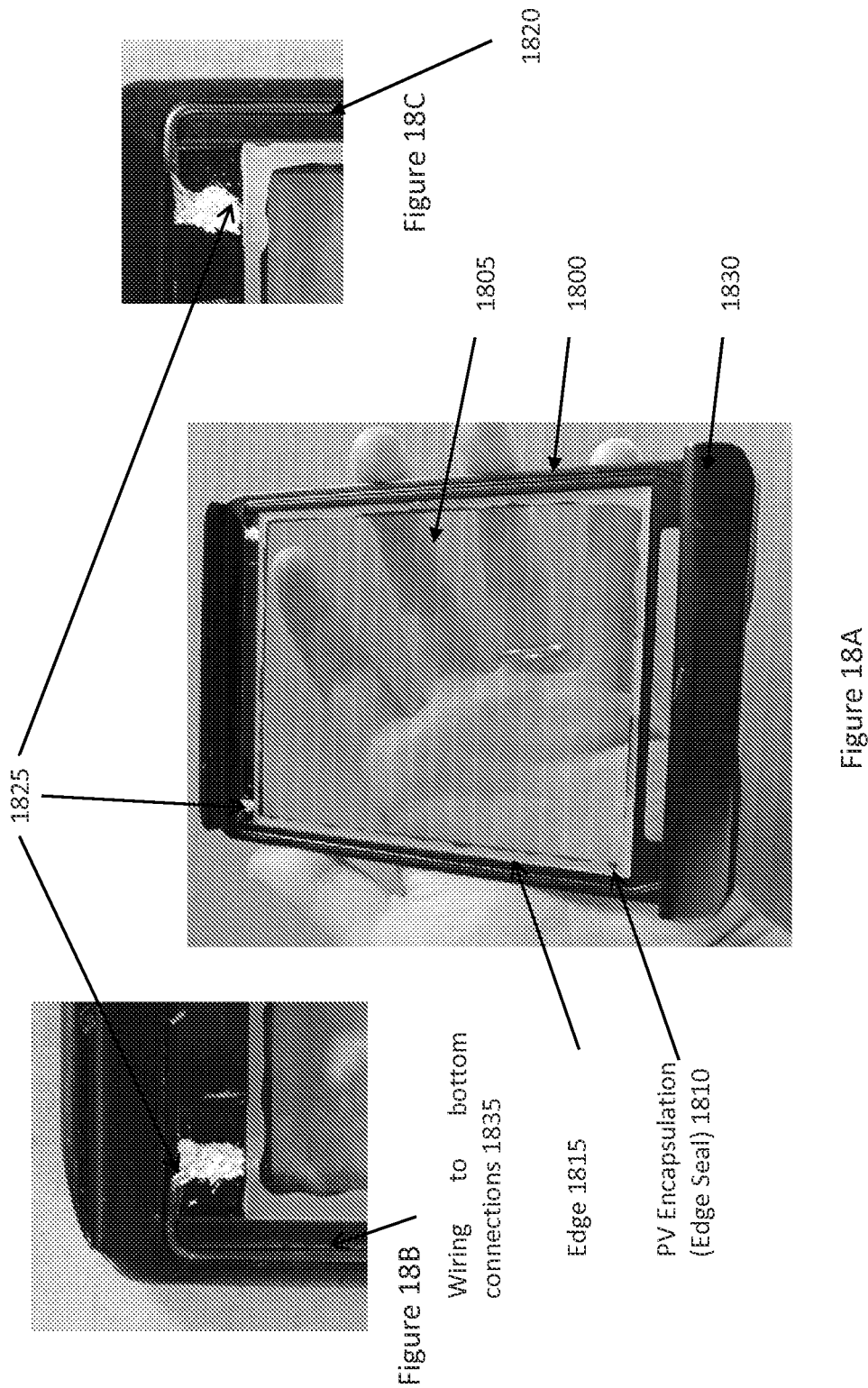

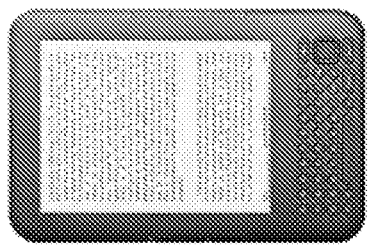
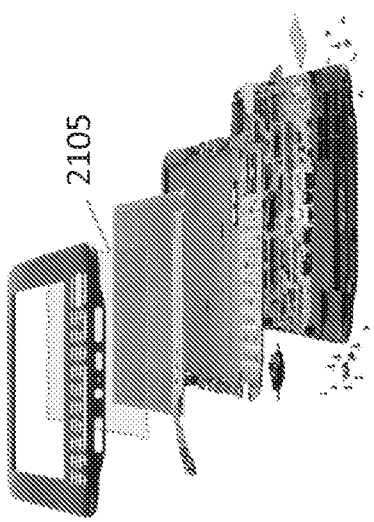
Figure 21B
Figure 21A

WAVELENGTH-SELECTIVE PHOTOVOLTAIC FOR A DISPLAY OR FOR A DEVICE WITH A DISPLAY

CROSS REFERENCE TO RELATED APPLICATIONS

This application claims the benefit of U.S. provisional application No. 61/708,389, filed Oct. 1, 2012, the contents of which are hereby incorporated by reference herein.

FIELD OF INVENTION

This application is related to the use of photovoltaic devices for devices or electronics.

BACKGROUND

Mobile devices, such as electronic reader devices, tablets, mobile phones, wearable electronic devices (e.g. watches, smart watches, and electronic eye glasses), and the like, use battery power that needs to be charged on a nearly daily, if not shorter, time period. Photovoltaic cells are being used to supplement battery life and different approaches have been used to incorporate the photovoltaic cells into the structure of the mobile device including the display. In an example approach, semi-transparent photovoltaic cells, which absorb visible light, are deposited on the display. In another approach, opaque photovoltaic layers are segmented around the display in the form of strips or to form apertures between which the light from the display passes.

In general, a display within such mobile devices allows the human eye to sense images and text in the form of visible light. This visible light is delivered to the eye from the display in the form of light emission (light emitting diode (LED) or liquid crystal display (LCD) displays) or light reflection (electrophoretic displays or printed ink/dyes on a substrate like paper).

The approaches described above lead to displays, which suffer from either (1) decreased performance (e.g. low luminance, low resolution, etc), due to light from the display being absorbed or blocked by non-transparent PV materials, or (2) having only a small surface area of photovoltaic material, which for a given cell type, is proportional to the total amount of energy generated.

SUMMARY

Described herein is an apparatus and method used to provide power or photovoltaic functionality to a display or device containing a display without impacting the visual perception of the display. The wavelength-selective photovoltaic (WPV) element is visibly transparent, in that it absorbs selectively around the visible emission (or reflection) peaks generated by the display. The photovoltaic material is able to cover a portion or an entire surface area of the display in addition to any non-display portions, without substantially blocking or perceptually impacting or affecting the emission (or reflection) of content from the display. The incident light that is absorbed by the photovoltaic element is then converted into electrical energy to provide power to the device or an adjacent device.

BRIEF DESCRIPTION OF THE DRAWINGS

FIGS. 6A and 6B show an embodiment of a WPV incorporated on a electronic device display as a removably attachable case or cover;

FIGS. 8A-8F show different views of a case in an attached state;

FIGS. 18A-18C show example wiring connections in a case including a WPV module;

FIGS. 21A and 21B show an embodiment of a mobile device that includes an integrated WPV.

DETAILED DESCRIPTION

Figure 1A:
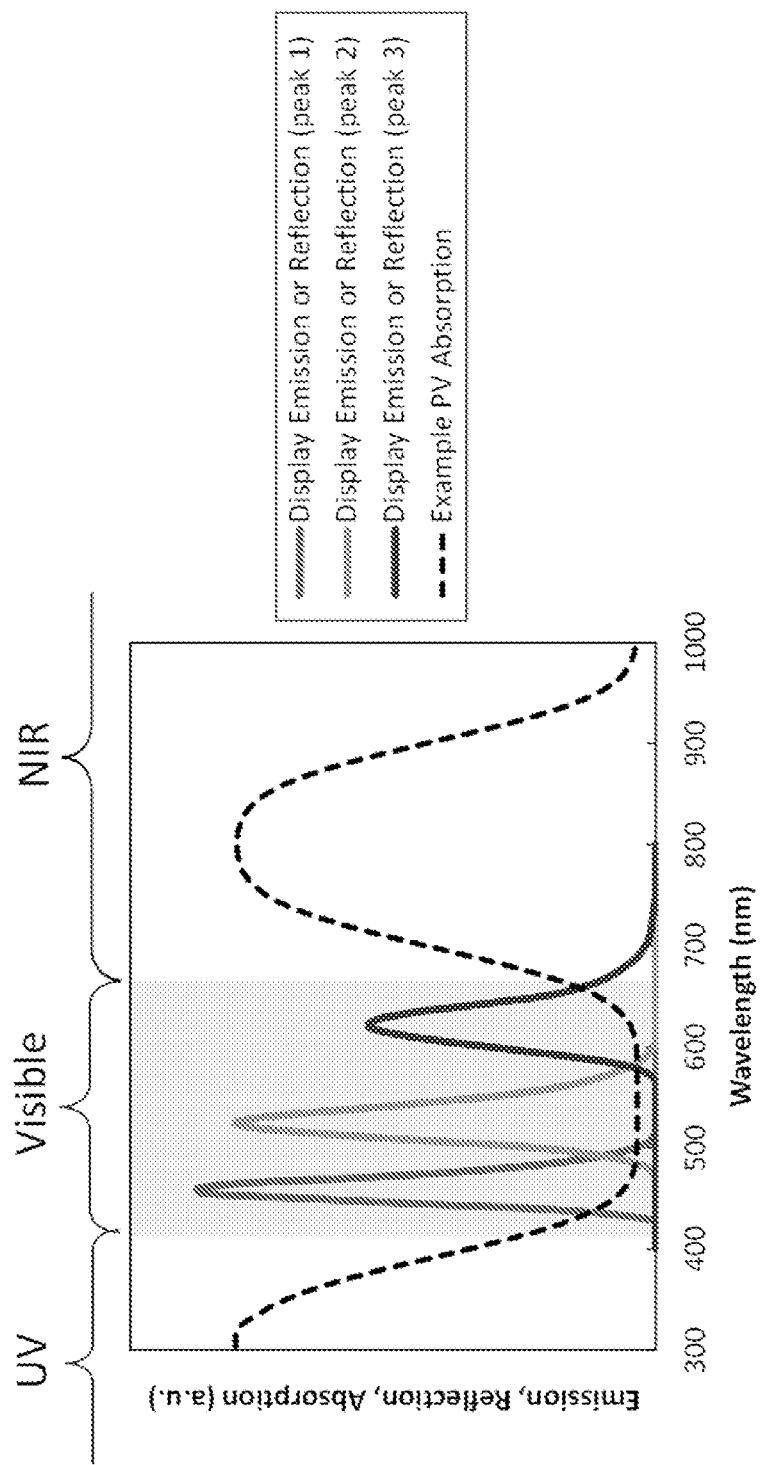
FIG. 1A shows an example absorption of a visibly transparent photovoltaic's absorption overlayed with an example display emission or reflection.

It is to be understood that the figures and descriptions of embodiments of a wavelength-selective photovoltaic (WPV) device, element or component have been simplified to illustrate elements that are relevant for a clear understanding, while eliminating, for the purpose of clarity, many other elements found in such electronics and packaging. Those of ordinary skill in the art may recognize that other elements and/or steps are desirable and/or required in implementing the WPV device, element or component. However, because such elements and steps are well known in the art, and because they do not facilitate a better understanding of the WPV device, element or component, a discussion of such elements and steps is not provided herein.

The non-limiting embodiments described herein are with respect to the WPV device, element or component. The embodiments and variations described herein, and/or shown in the drawings, are presented by way of example only and are not limiting as to the scope and spirit. The WPV device, element or component may be used in a number of applications. Applicable parts may be made using manufacturing methods shown in U.S. Publication No. 20110010911, entitled "METHODS AND APPARATUS FOR LIGHT HARVESTING IN DISPLAYS", filed Jun. 23, 2010 and published Jan. 20, 2011; and in U.S. Publication No. 20120186623, entitled "TRANSPARENT PHOTOVOLTAIC CELLS", filed Jan. 25, 2012 and published Jul. 26, 2012; and in U.S. patent application Ser. No. 13/495,379, entitled "VISIBLY TRANSPARENT, LUMINESCENT SOLAR CONCENTRATOR", filed on Jun. 13, 2012, the contents of which are herein incorporated by reference herein in their entireties as if set forth herein. In some embodiments, the WPV is a transparent PV (TPV), and the TPV is a visibly or visible light TPV. In general, the WPV may be constructed from (but is not limited to) an organic PV, a molecular PV, and luminescent solar concentrator, a semiconductor nano-crystal PV, or an inorganic PV, The PV may also include (but is not limited to) semiconductors or molecular dyes from the group of phthalocyanines, napthalocyanines, porphyrins, fullerenes, and carbon nanotubes.

Disclosed herein is a device used to provide power to devices with displays, including, for example, mobile devices, electronic reader devices, tablets, mobile phones, wearable electronic devices (e.g. watches, smart watches, and electronic eye glasses), portable electronic devices, outdoor signage, building signage, traffic signs and the like. The device incorporates a WPV positioned over the display of the device. The WPV may selectively transmit a portion of visible light, while absorbing and converting to electricity a portion of the ultraviolet and infrared light. As described herein below, in some embodiments, the WPV may take the form of a case, cover or other similar structure that interfaces with electrical ports such as a Universal Serial Bus (USB) or other like ports of the mobile device in order to provide power or energy to the battery or other components within the device or adjacent devices. In other embodiments, the WPV may take a more integrated format with the device display stack. For purposes of illustration, the examples are described herein with respect to mobile devices, but are equally applicable to other devices having displays.

A WPV is described herein that can be positioned with respect to a display or integrated with a display, in which the photovoltaic material absorbs selectively around the emission (or reflection) peaks generated by the display. Thus, the photovoltaic material is able to cover a portion or an entire surface area of the display, without substantially blocking or perceptibly impacting or affecting the emission (or reflection) of content from the display. In some embodiments, the photovoltaic material may also cover non-display portions of the device having the display. For purposes of illustration only, the non-display portion may be a frame, edge, back, or side, for example. The light absorbed by the photovoltaic material can originate either from within the display or from light incident on the display from the external environment. The photovoltaic action generated from such a WPV may be used to provide power for the device or some adjacent device. This could be through charging a battery or capacitor, or directly driving specific electronic components, for example. In some embodiments, the WPV may be integrated with some form of power electronics to regulate the voltage and current output.

In other embodiments, the WPV may additionally be utilized for sensing functionality. In this case, the WPV may be pixelated or segmented across the display area to provide unique sensing regions, in which the voltage and current output of each region may vary depending on which regions are shadowed or partially shadowed from incident light by the external environment, for example by a hand or finger.

In general, a display allows the human eye to sense images and text in the form of visible light (i.e. photons with wavelengths from about 450 nanometers to about 650 nanometers). This visible light can be delivered to the eye from the display in the form of light emission (for example, but not limited to, light emitting diode (LED), liquid crystal display (LCD) displays, organic LED (OLED) or the like) or light reflection (for example, but not limited to, electrophoretic displays, eInk, printed ink/dyes on a substrate like paper, or the like). In many cases this light emission or reflection from the display can be resolved into multiple distinct wavelength ranges or peaks. For example, a common LCD or LED display has a red peak (635-700 nm), a green peak (490-560 nm), and a blue peak (450-490 nm). These peaks are combined to create the perception of a full spectrum of colors from the display.

Thus, to maintain the viewability of the display in this invention, the WPV that is incorporated in or above the display has one or more absorption peaks (with corresponding transmission minima) structured selectively around the peaks generated by the display emission or reflection (where the WPV has corresponding local absorption minima and transmission maxima). The WPV's selective absorption should be understood to mean that the magnitude of the WPV's absorption peak is greater than the magnitude of the WPV's absorption at wavelengths in the regions where the display has significant emission or reflection.

As noted herein above a TPV is a type of WPV and is used here for illustration purposes only and does not limit or restrict the term WPV. FIG. 1A shows an example absorption, for purposes of illustration only, of a visibly TPV's absorption overlayed with an example display emission or reflection, examples of which are described herein above. In this embodiment, the visibly TPV only has two absorption peaks outside of the visible part of the spectrum (about 450 nm-650 nm): one in the ultraviolet (UV) (below about 450 nm) and one in the near infrared (NIR) (above about 650 nm), in which the magnitude of the TPV material's absorption peaks are greater than the magnitude of the TPV material's absorption at any wavelength between about 450 and 650 nanometers (the transparent region (shaded region)). The WPV in general, and in this embodiment, the TPV converts the absorbed light into electrical energy.

The display can be viewed by the user while the WPV is harvesting light energy to power some portion of the device, (for example, a battery or other function). Viewability is possible either through visible light emission from the display, which is able to pass through the WPV to the viewer's eye, or through reflection of ambient light, which is able to pass through the WPV to the device and be reflected back through the WPV to the reader's eye.

Figure 1B:
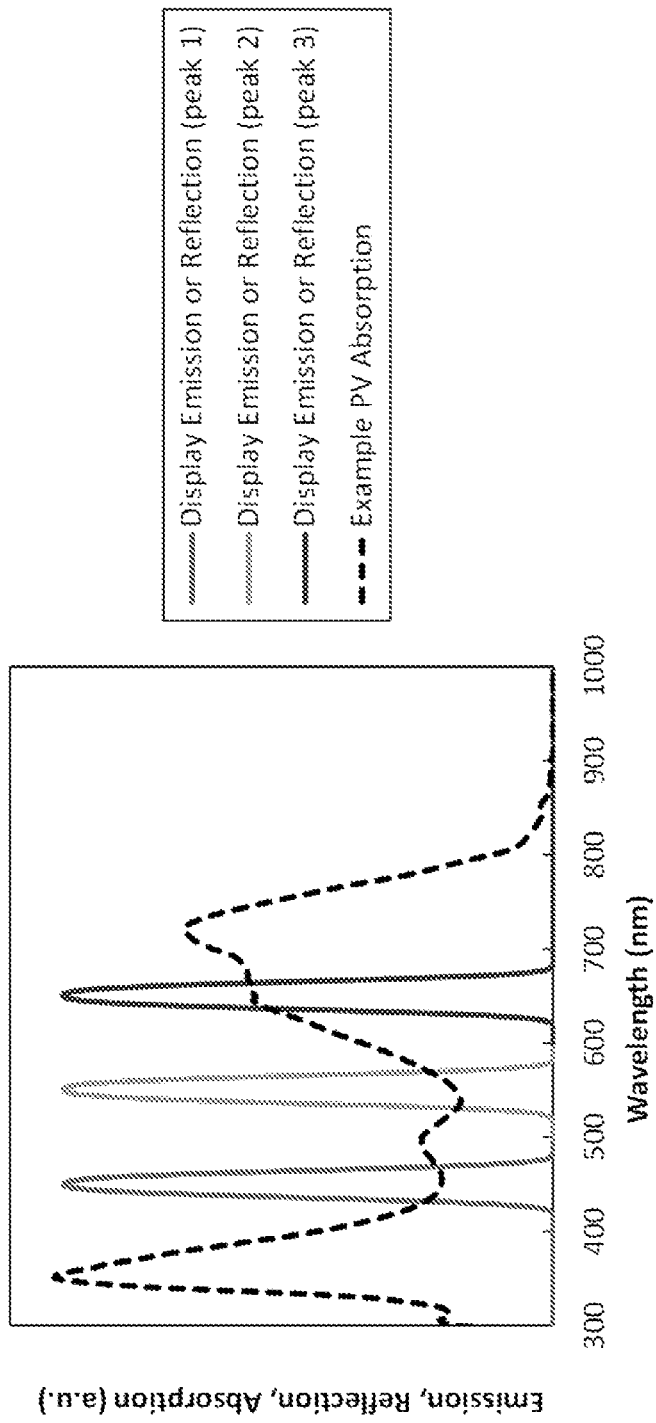
FIG. 1B shows another example absorption of a visibly transparent photovoltaic's absorption overlayed with an example display emission or reflection.

FIG. 1B shows another example absorption, for purposes of illustration only, of a visibly TPV's absorption overlayed with an example display emission or reflection for a molecular PV based on fullerne C60 and chloroaluminum phthalocyanine (ClAlPc) semiconductors, as described in U.S. Publication No. 20120186623, entitled "TRANSPARENT PHOTOVOLTAIC CELLS", filed Jan. 25, 2012 and published Jul. 26, 2012, the contents of which are herein incorporated by reference herein in their entireties as if set forth herein.

Figure 1C:
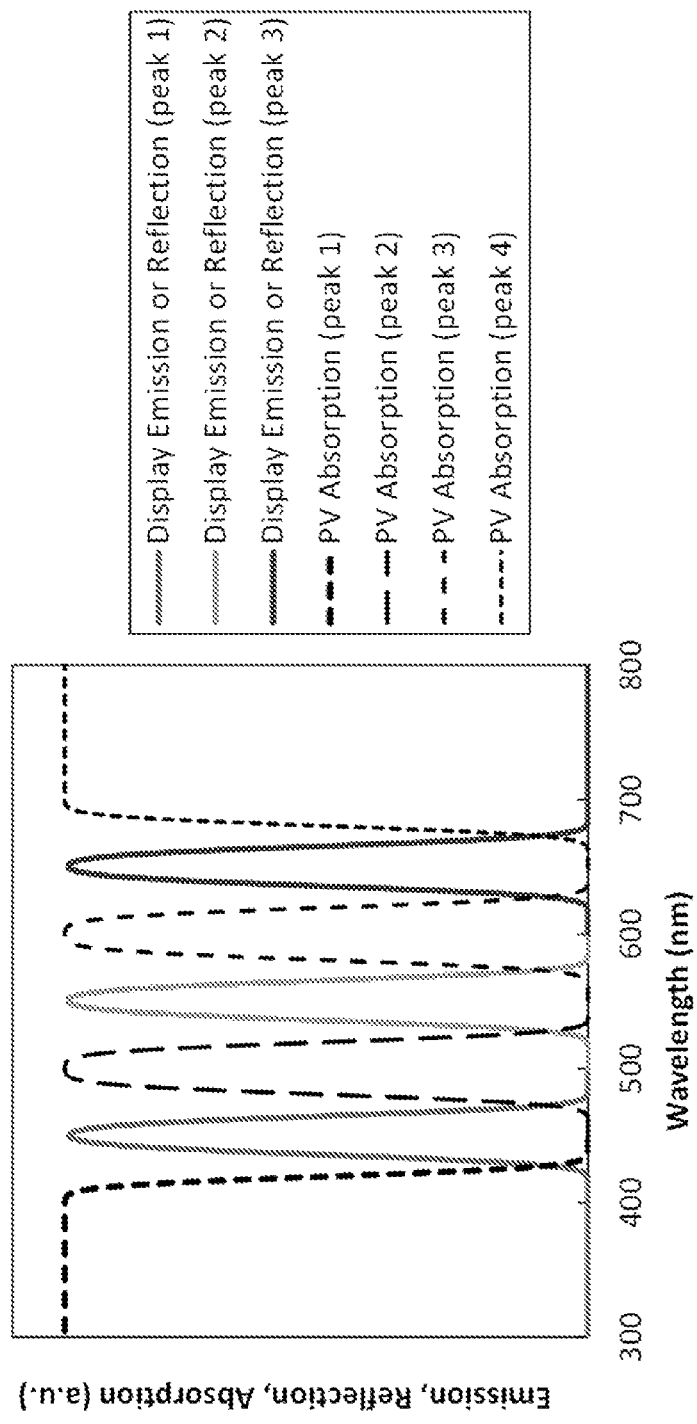
FIG. 1C shows an example absorption of a WPV absorption overlayed with an example display emission or reflection.

FIG. 1C shows an example absorption of a WPV absorption overlayed with an example display emission or reflection. FIG. 1C is a generalized example of other combinations of display emission coupled with complementary WPV absorption, but is not limited to the example combinations shown. In this example, the display has three emission maxima (which also define 4 regions of absorption minima). The WPV material's absorption is designed with one to four complementary absorption peaks/ranges (and respective minima): 1) absorption peak or range at wavelengths below the first display emission peak/range; 2) absorption peak or range at wavelengths between the first and second display emission peaks/range; 3) absorption peak or range at wavelengths between the second and third display emission peaks/range; and 4) absorption peak or range at wavelengths above the third display emission peak/range. The number of emission maxima are shown for illustration purposes only and the number is variable with respect to the display.

Figure 2:
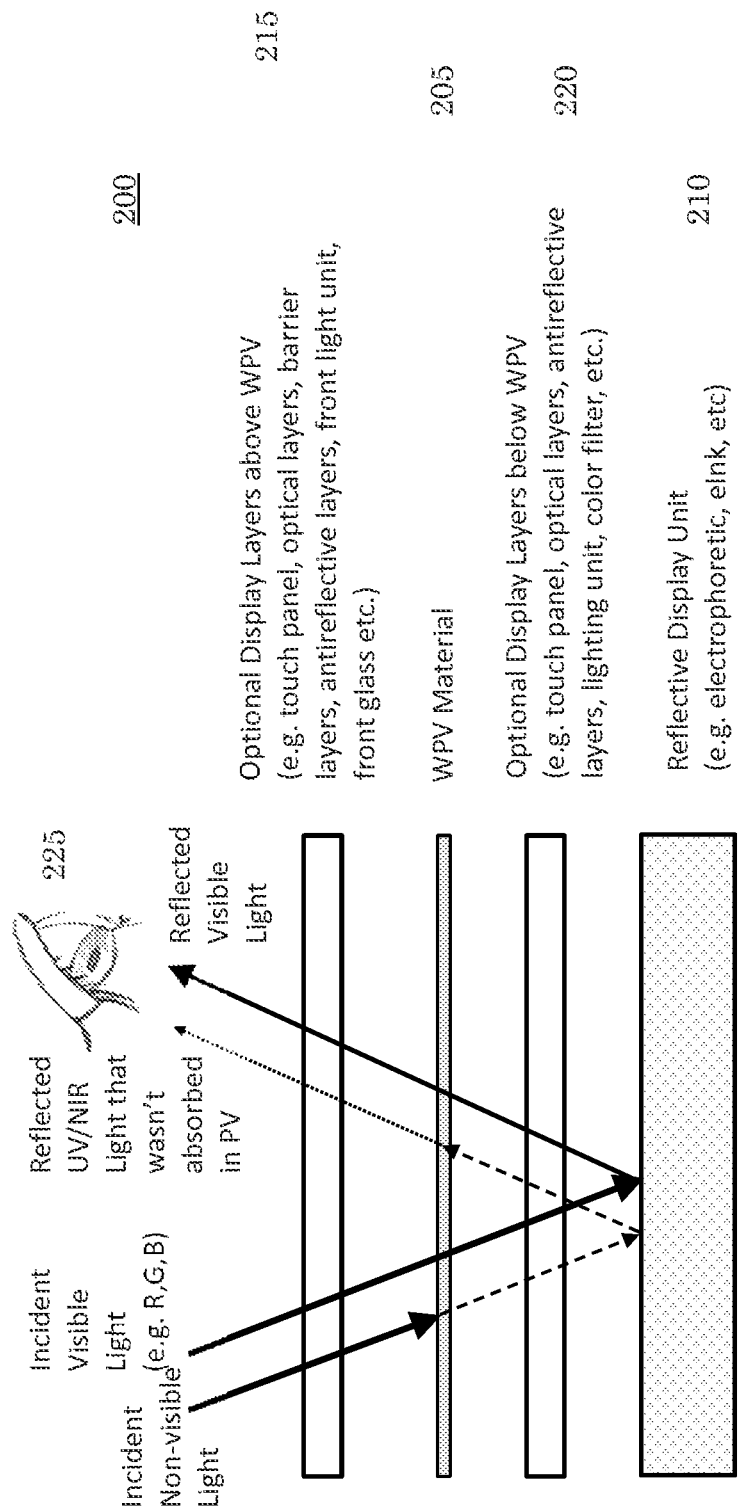
FIG. 2 shows an example reflective light display stack with a wavelength-selective photovoltaic (WPV)

FIG. 2 shows an example reflective-type display stack 200 with a WPV 205. The WPV 205 overlays a reflective display unit (RDU) 210, which may be an electrophoretic, eInk and the like, for example. In an embodiment, the display stack 200 may further include display layers above the WPV 215, which may be one or a combination of a touch panel, optical layers, barrier layers, antireflective layers, front light unit, front glass and the like. In another embodiment, the display stack 200 may include display layers below the WPV 220, which may be one or a combination of touch panel, optical layers, antireflective layers, lighting unit, color filter, and the like. In another embodiment, the display stack 200 may include display layers 215 and 220, as appropriate and applicable.

In an embodiment, the WPV 205 is a discrete component within the display stack 200. In another embodiment, the WPV 205 is a discrete removably attachable component on the exterior of the display stack 200. For example, a case, a cover or any similar structure. In another embodiment, the WPV 205 is a coating on an existing layer in the display stack 200, where the existing layer may be a touch panel layer, optical layers, barrier layers, antireflective layers, front light unit, front glass, display unit, and the like, for example. In another embodiment, the WPV 205 may be embedded within an existing layer in the display stack 200, where the existing layer may be a touch panel layer, optical layers, barrier layers, antireflective layers, front light unit, front glass, display unit, and the like, for example.

In the reflective light display stack 200, the display works by reflecting ambient visible light back to a viewer's eye 225. The WPV 205 allows a significant portion of this visible light to transmit through, thus maintaining the function of the display, while selectively absorbing a significant portion of the incident non-visible light (e.g. LTV and/or NIR) to convert into electrical energy, (as represented in FIG. 2 by the solid arrow transitioning into a dashed arrow).

Figure 3A:
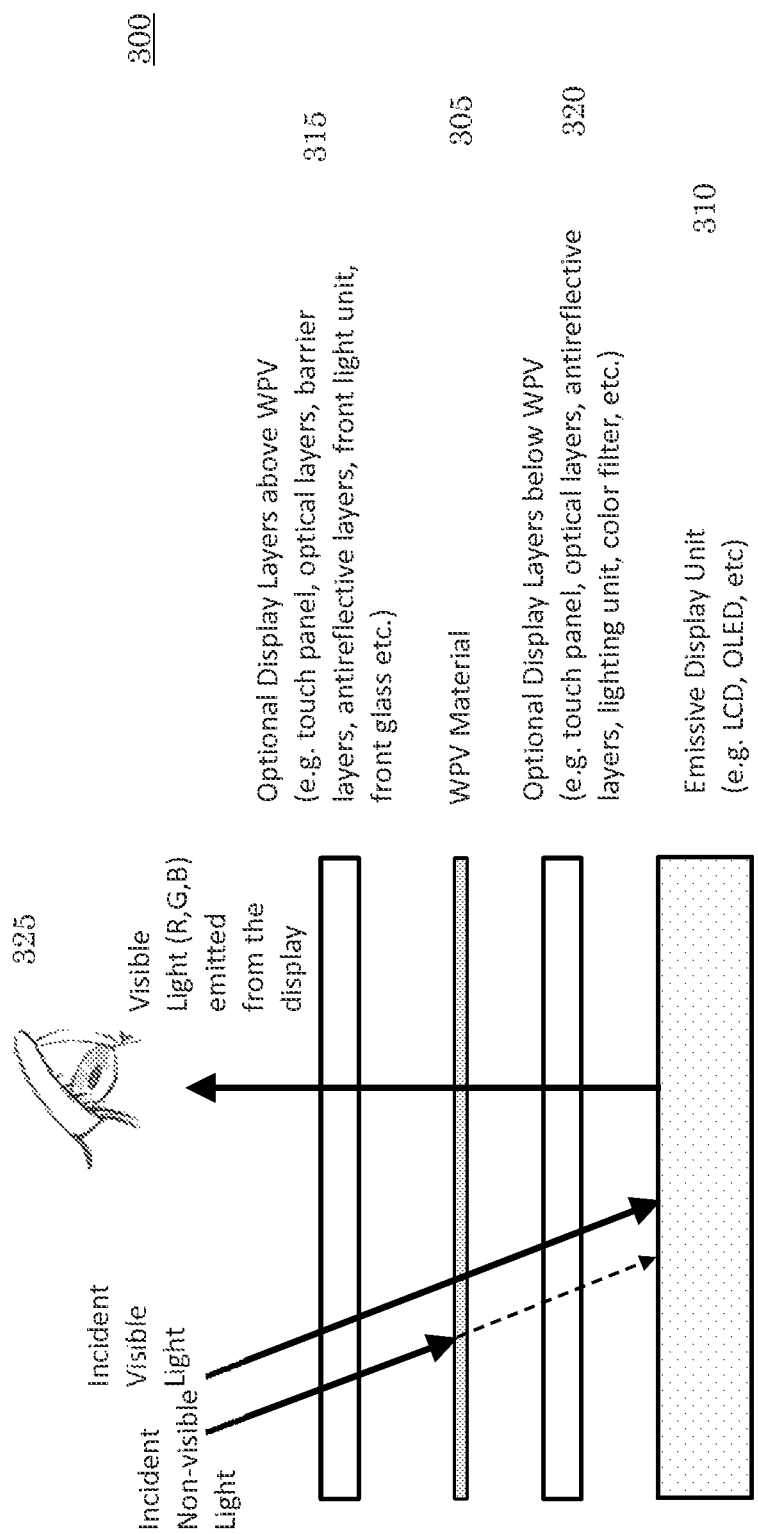
FIG. 3A shows an example emissive light display stack with a WPV.

FIG. 3A shows an example emissive-type display stack 300 with a WPV 305. The WPV 305 overlays an emissive display unit (EDU) 310, which may LCD, OLED, LED and the like, for example. In an embodiment, the display stack 300 may further include display layers above the WPV 315, which may be one or a combination of a touch panel, optical layers, barrier layers, antireflective layers, front light unit, front glass and the like. In another embodiment, the display stack 300 may include display layers below the WPV 320, which may be one or a combination of touch panel, optical layers, antireflective layers, lighting unit, color filter, and the like. In another embodiment, the display stack 300 may include display layers 315 and 320, as appropriate and applicable.

Figure 3B:
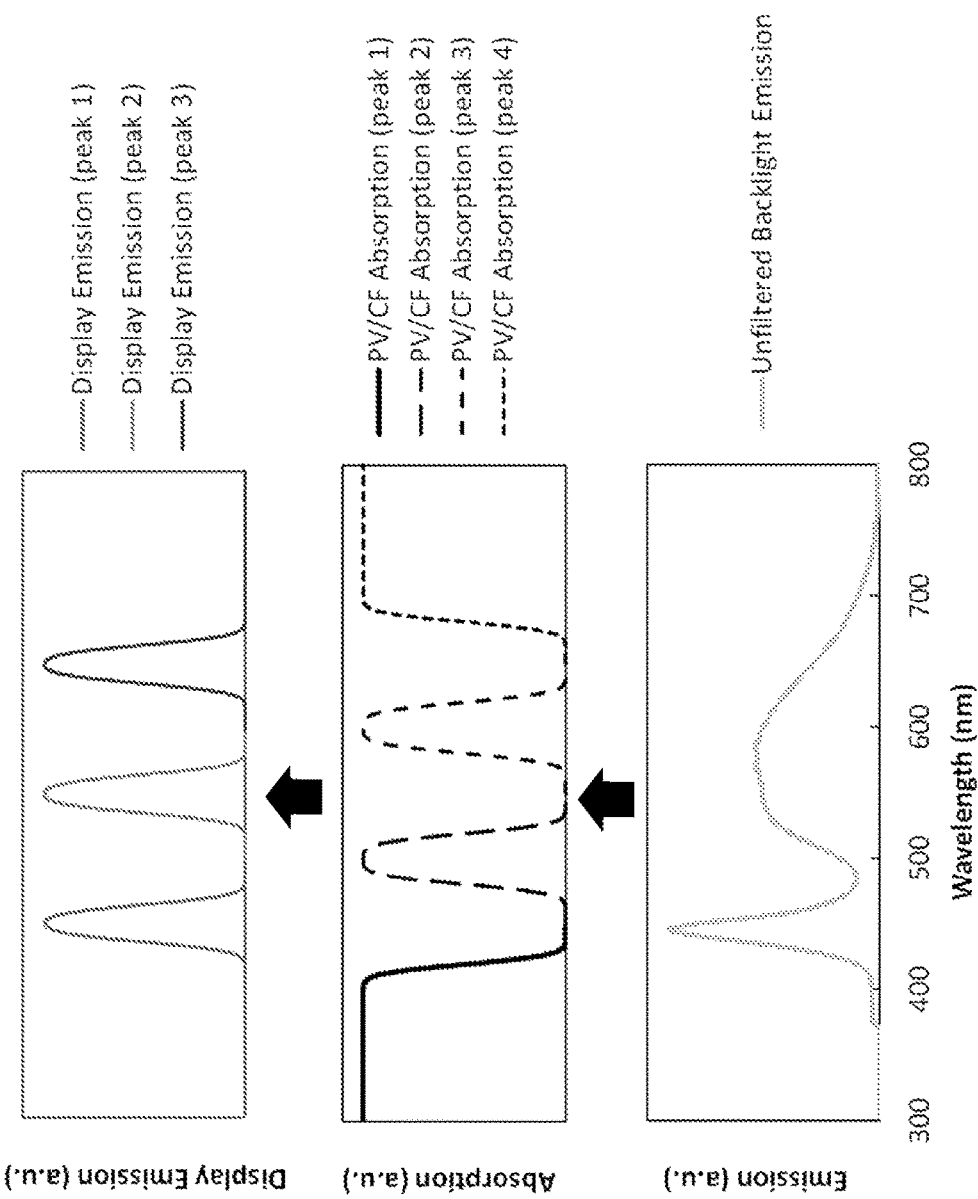
FIG. 3B shows an example of desired emission peaks when a WPV acts as a color filter.

In an embodiment, the WPV 305 is a discrete component within the display stack 300. In another embodiment, the WPV 305 is a discrete removably attachable component on the exterior of the display stack 300. For example, a case, a cover or other similar structure. In another embodiment, the WPV 305 is a coating on an existing layer in the display stack 300, where the existing layer may be a touch panel layer, optical layers, barrier layers, antireflective layers, front light unit, front glass, display unit, and the like, for example. In another embodiment, the WPV 305 may be embedded within an existing layer in the display stack 300, where the existing layer may be a touch panel layer, optical layers, barrier layers, antireflective layers, front light unit, front glass, display unit, and the like, for example. FIG. 3B shows an example of desired emission peaks when a WPV acts as a color filter. In this example, the backlight is filtered by the WPV absorption to produce the desired emission peaks.

In the emissive-type display stack 300, the display works by emitting light from the display unit out into a viewer's eye 325. The WPV 305 allows a significant portion of this visible light to transmit through, thus maintaining the function of the display, while selectively absorbing a significant portion of the externally incident non-visible light (e.g. LTV and/or NIR) to convert into electrical energy, (represented in FIG. 3A by the solid arrow transitioning into a dashed arrow).

Figure 4:
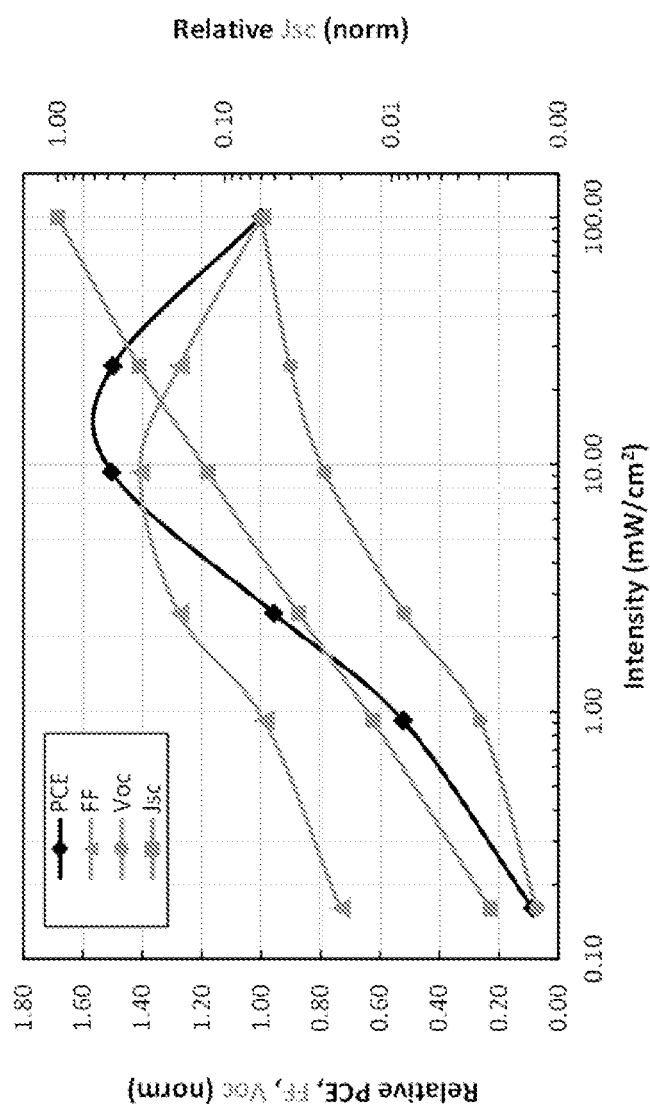
FIG. 4 shows an example chart of relative performance of a ultraviolet/near infrared (UV/NIR)-selective WPV under various solar illumination intensities.
Figure 5C:
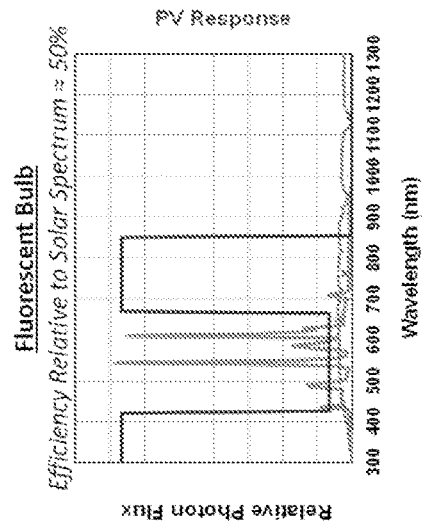
FIGS. 5A-5C show examples of relative performance of a UV/NIR-selective WPV under various artificial light sources.
Figure 5A:
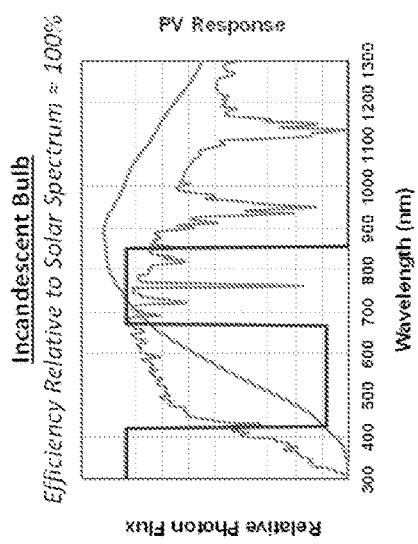
Figure 5B:
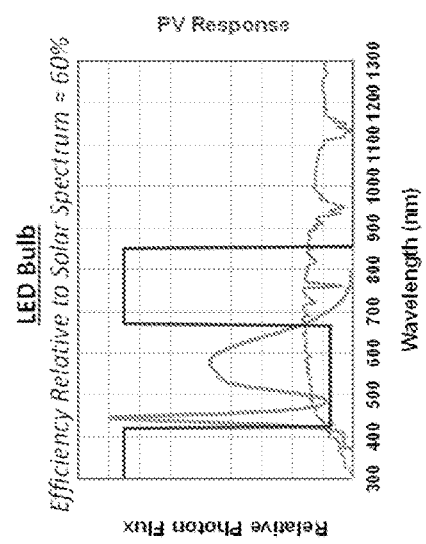

In some embodiments, the device will be exposed to various different lighting environments, and thus, the WPV can be used to harvest direct sunlight, ambient sunlight, and/or artificial light. The power output from the WPV will vary based on the illumination intensity and lighting spectrum. The WPV may be optimally designed for various lighting conditions by modifying the spectral response/absorption of the WPV semiconductors to match the light source of interest. FIG. 4 shows an example chart of relative performance of a UV/NIR-selective TPV, as described in U.S. Publication No. 20120186623, entitled "TRANSPARENT PHOTOVOLTAIC CELLS", filed Jan. 25, 2012 and published Jul. 26, 2012, the contents of which are herein incorporated by reference herein in their entireties as if set forth herein, under various solar illumination intensities, corresponding to direct sunlight (100 mW/cm$^2$) and ambient sunlight light with lower illumination intensity (<100 mW/cm$^2$), where PCE=power conversion efficiency, FF=fill factor, Voc=open circuit voltage, and Jsc=short circuit current. FIGS. 5A-5C show examples of relative performance of a UV/NIR-selective photovoltaic under various artificial light sources, including an incandescent bulb in FIG. 5A, a LED bulb in 5B and a fluorescent bulb in FIG. 5C.

FIGS. 6A and 6B show an embodiment of a WPV incorporated as a case 600 for a mobile device 605 in a detached configuration and in an attached configuration, respectively. For example, the case 600 may be an aftermarket device that can be used with any type of mobile device. In some embodiments, the case 600 may be made of plastic, metal, flexible material and the like.

Figures 7A, 7B, 7C, 7D, 7E, 7F:
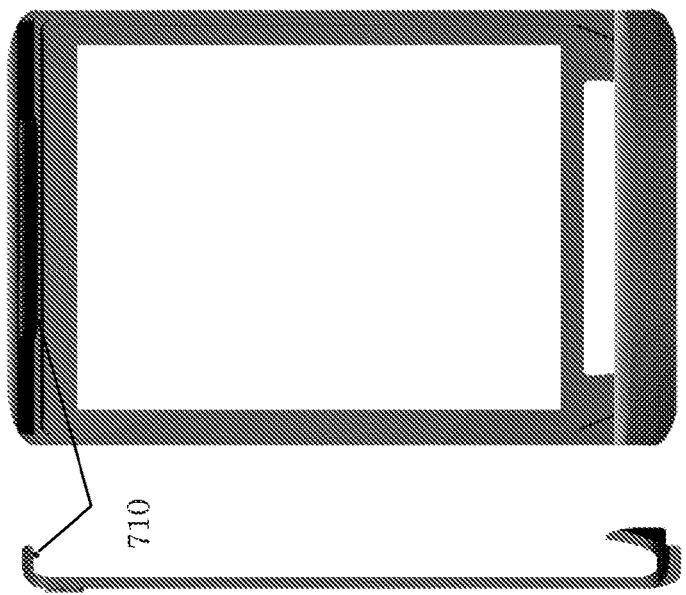
FIGS. 7A-7F show different views of a case in a detached state.

FIGS. 7A-7F show different views of a case 700 in a detached state. FIG. 7A shows a front view of the case 700 depicting an area for power electronics and electrical connectivity (705) to a device. FIG. 7B shows a side view of the case 700 depicting lip snaps 710 or like engagement and holding structures for attachment to the mobile device.

FIGS. 7C and 7D show top and bottom views of the case 700. FIG. 7E shows a rear view of the case 700 depicting lip snaps 710 or like engagement and holding structures for attachment to the mobile device. FIG. 7F shows another side view of the case 700 depicting lip snaps 710 or like engagement and holding structures for attachment to the mobile device. FIGS. 8A-8F show different views of a case 800 in an attached state with a mobile device 805.

Figure 9:
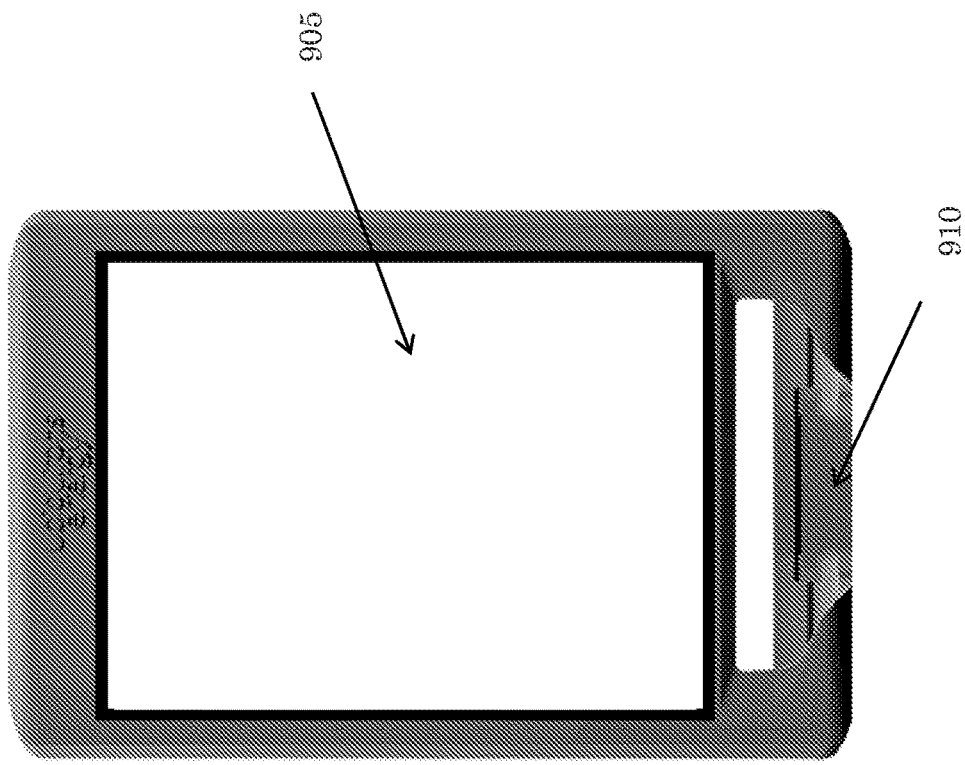
FIG. 9 shows a front view of an embodiment of a case.
Figure 10:
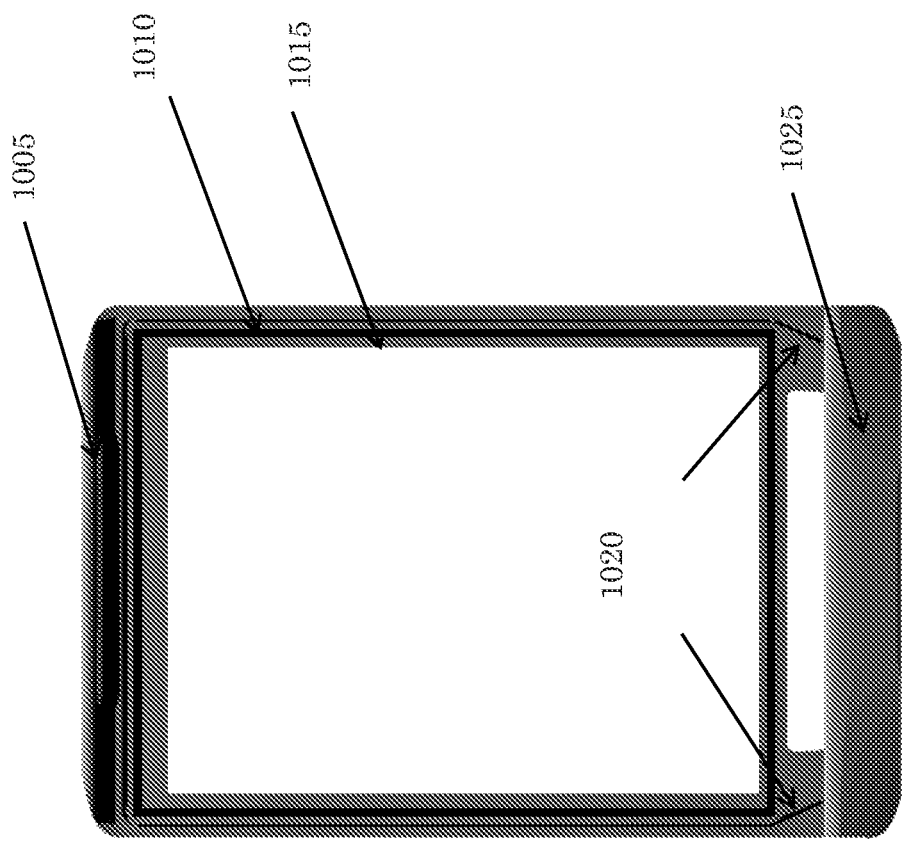
FIG. 10 shows a rear view of an embodiment of a case.

FIG. 9 shows a front view of a case 900 illustrating a display area 905 for a transparent photovoltaic module or assembly and an area 910 for power electronics and electrical connectivity to a mobile device as further described herein. FIG. 10 shows a rear view of a case 1000 illustrating lip snaps 1005 that may be aligned with a top of a mobile device, a display area 1010 for the transparent photovoltaic module, an edge 1015 for supporting the transparent photovoltaic module via adhesive or epoxy, grooves 1020 on a left and right side for wiring top of the transparent photovoltaic module to bottom electrical connectivity, and a bottom cavity 1025 for housing mobile device and electronic connectivity.

Figure 11:
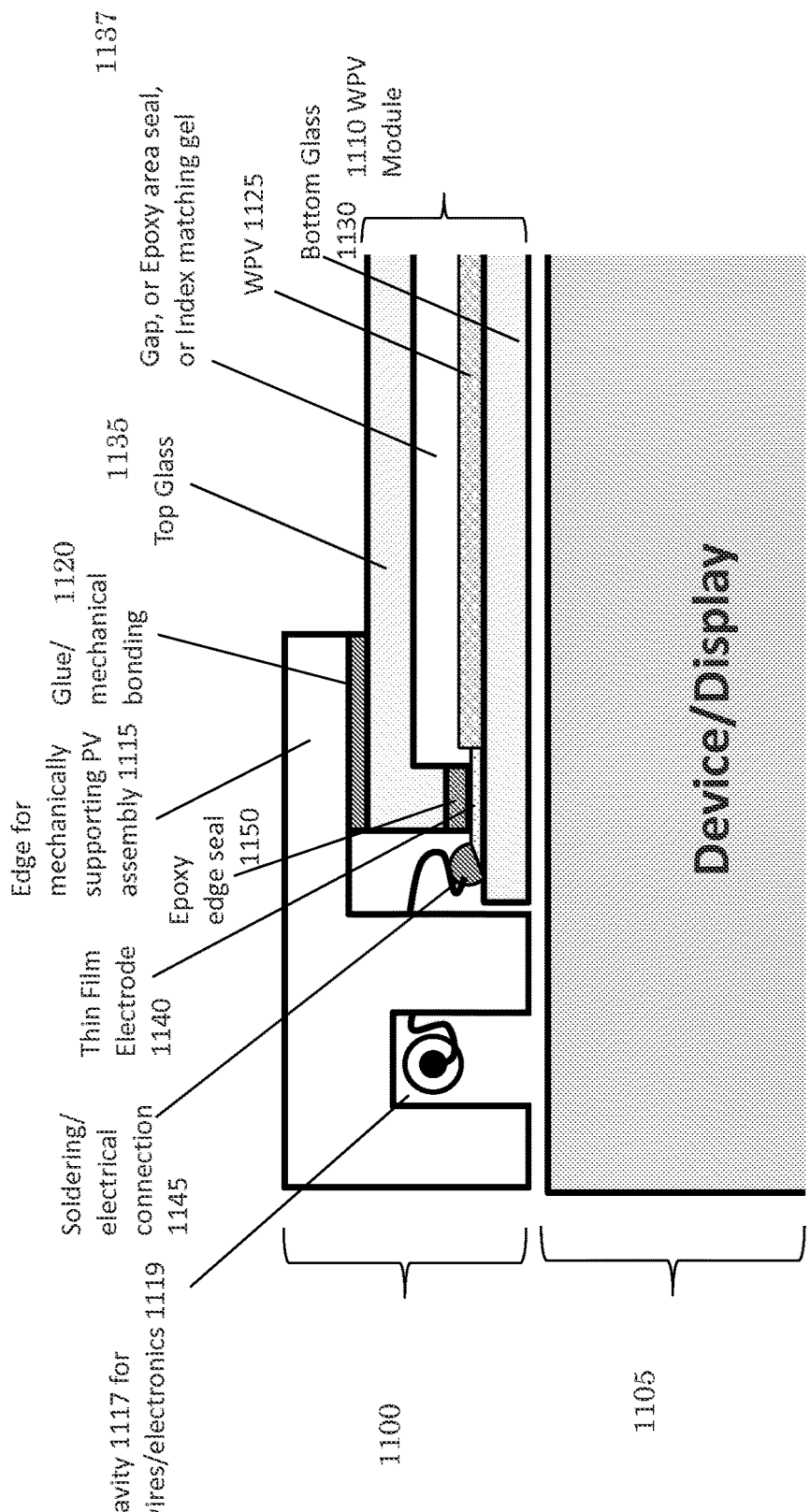
FIG. 11 shows a cross sectional diagram of an embodiment of a case.

FIG. 11 shows a cross sectional diagram taken across line A-A' of the case 800 attached to a mobile device 805 as shown in FIG. 8E. In particular, FIG. 11 shows a case 1100 attached to a mobile device 1105. The case 1100 includes a WPV module or assembly 1110 that is connected to an edge section 1115 using, for example but not limited to, glue, mechanical bonding or the like (1120). The edge section 1115 further includes a cavity 1117 for placement of wires and/or electronics 1119. The wires 1119, for example, as shown in FIG. 10, are guided through grooves 1020 to connect to electronics and connectors in the bottom cavity 1025.

The WPV module or assembly 1110 includes a WPV 1125 overlaid on a substrate, for example, a bottom glass 1130. Another substrate, for example, a top glass 1135 is physically isolated from but positioned over the WPV 1125. In some embodiments, a gap is maintained between the top glass 1135 and the TPV 1125, an epoxy area seal is used between the top glass 1135 and the WPV 112 or an index matching gel is used between the top glass 1135 and the WPV 1125 (1137), to separate and support the top glass 1135 with respect to the WPV 1125. The top glass 1135 is connected to the edge 1115 as described above. An electrode 1140 is connected to the WPV 1125 and connected to wires 1119 via soldering or like electrical connection 1145. The electrode, for example, may be a thin film electrode or the like. An epoxy edge seal 1150 or the like is used to connect, support and separate the top glass 1135 with respect to the electrode 1140. In the embodiments described herein, the substrates may be plastic, glass or flexible. In another embodiment, the back surface of the WPV module may include an adhesive or texturing mechanism for interfacing with the mobile device display to match index of refraction and/or reduce glare.

Figure 12:
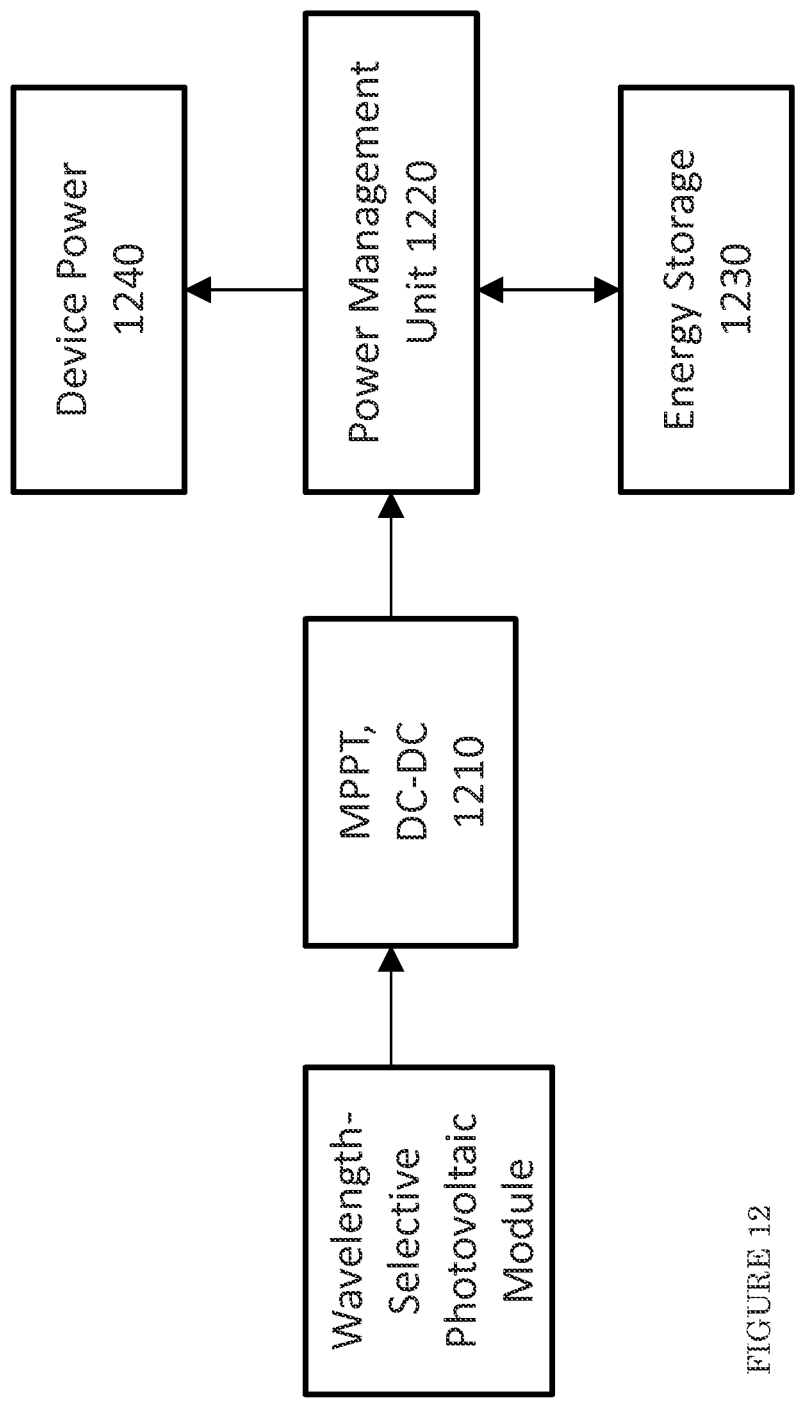
FIG. 12 shows an example top level diagram of the electronics and electronics functionality.

FIG. 12 shows an example top level diagram of the electronics and electronics functionality with respect to the embodiments described herein. A WPV module 1200 is connected to an electronics module 1210, which in turn is connected to a power management module 1220. The power management module 1220 is connected to device electronics 1230 and an energy storage device 1240 in the mobile device. In particular, the electrical power generated by the WPV module 1200 can be used to charge the energy storage device 1240 within the mobile device (such as a battery or capacitor), be used to directly power electronics within the device (1240), or both. In some embodiments, the electronic module 1210 may contain boost converters and/or buck converters to convert the DC voltage provided from the WPV module 1200 to a suitable level for utilization within the mobile device (e.g. for the battery or capacitor, and/or for powering specific electronic functions within the device). The electronics module 120 may also include maximum power point tracking (MPPT) to optimally operate the WPV module 1200 depending on the lighting conditions and resulting photovoltaic current-voltage performance. The converted PV power output can then be directed through the power management unit 1220 to either charge the energy storage device 1230 for later use, or provide power for immediate device utilization (1240).

Figure 13:
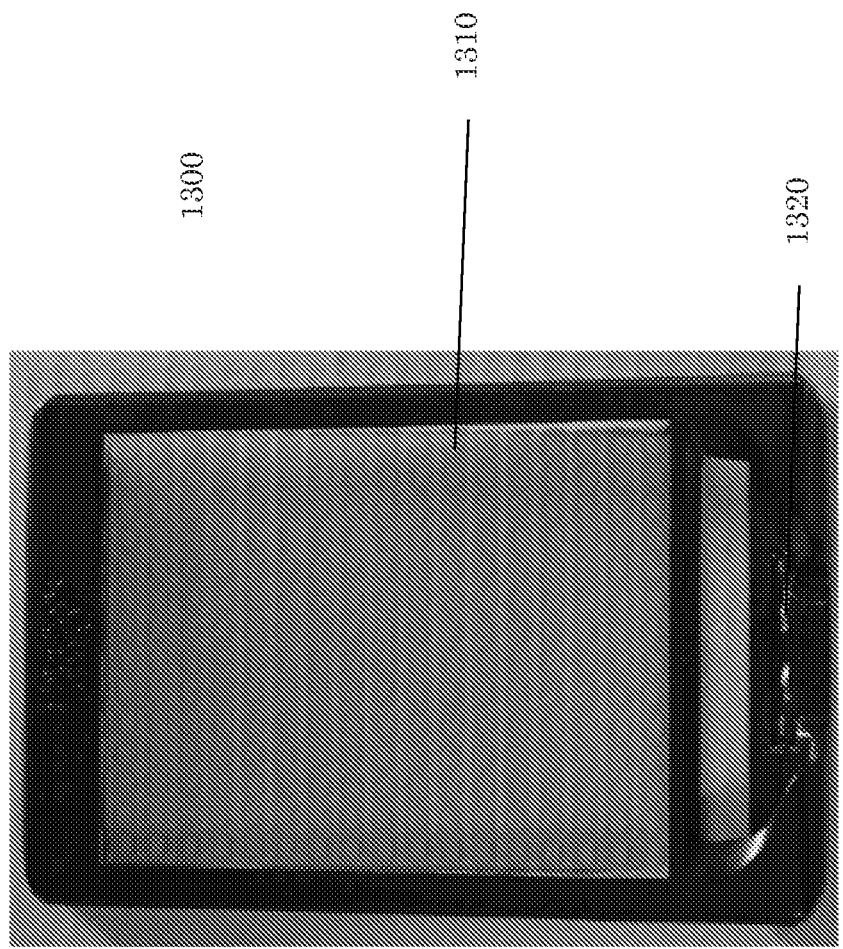
FIG. 13 shows an example embodiment of a case including a WPV module and electrical connectors.
Figure 16:
FIG. 16 shows an example view of electrical connectors in an embodiment of a case.
Figure 17:
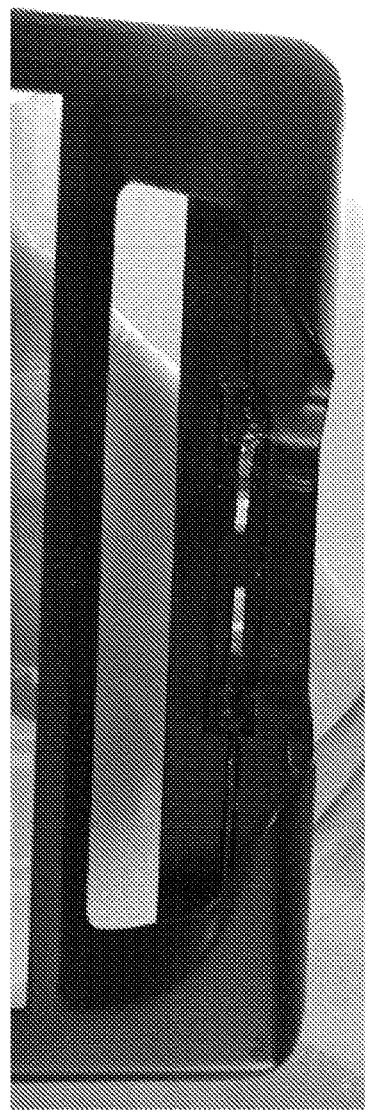
FIG. 17 shows another example view of electrical connectors in an embodiment of a case.

FIG. 13 shows an example embodiment of a case 1300 including a WPV module 1310 and electrical connectors 1320. FIGS. 16 and 17 show different views of the electrical connectors 1320 of FIG. 13. The electrical connectors 1320 may be any electrical connector, for example but not limited to, USB ports, posts, plugs, sockets, and the like.

Figure 14:
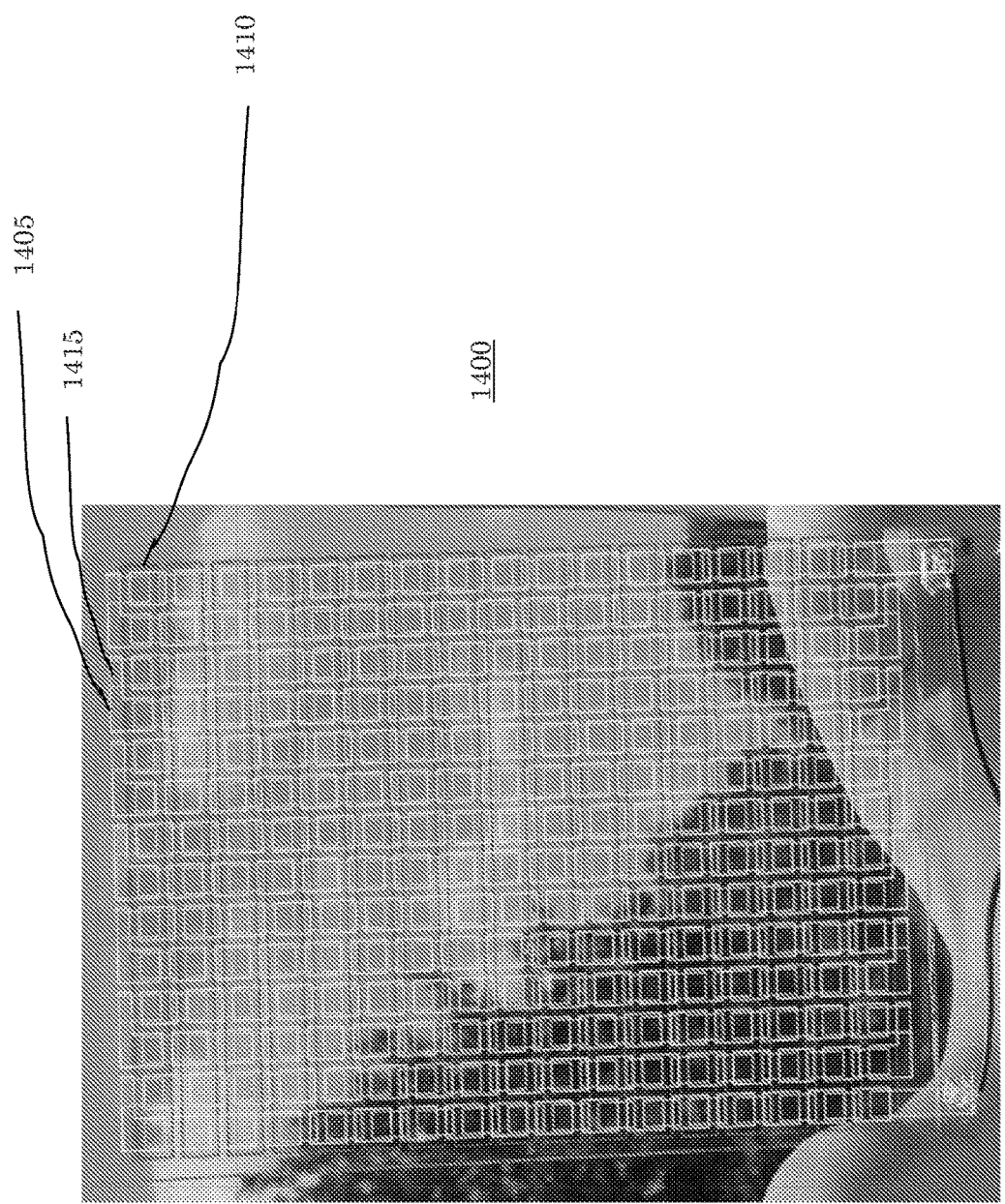
FIG. 14 is an example embodiment of a WPV that illustrates a device layer overlap pattern.

In an embodiment, as illustrated in FIGS. 13 and 14, the photovoltaic material can consist of individual photovoltaic cells are that are monolithically or otherwise connected in some combination of series and parallel connections. The photovoltaic material can be patterned by shadow masking, scribing, laser scribing, or lithography to additively pattern a bottom electrode, active layers, and top electrode. The additive patterning is performed such that anode-to-cathode interconnections are formed between series-integrated individual cells and anode-to-anode or cathode-to-cathode interconnections are formed between parallel-integrated cells. Generally, the series-integrated cells will result in an approximate summation of individual cell voltages, while parallel-integrated subcells will result in an approximate summation of individual cell currents. The area between subcells should be minimized in order to maximize power output and minimize visual perception. In some embodiments, blocking and parallel diodes can be incorporated to prevent electrical buffering discharge and shading effects, respectively, where the diodes can be readily integrated around the array periphery without a visual impact with appropriate array design.

Figure 15:
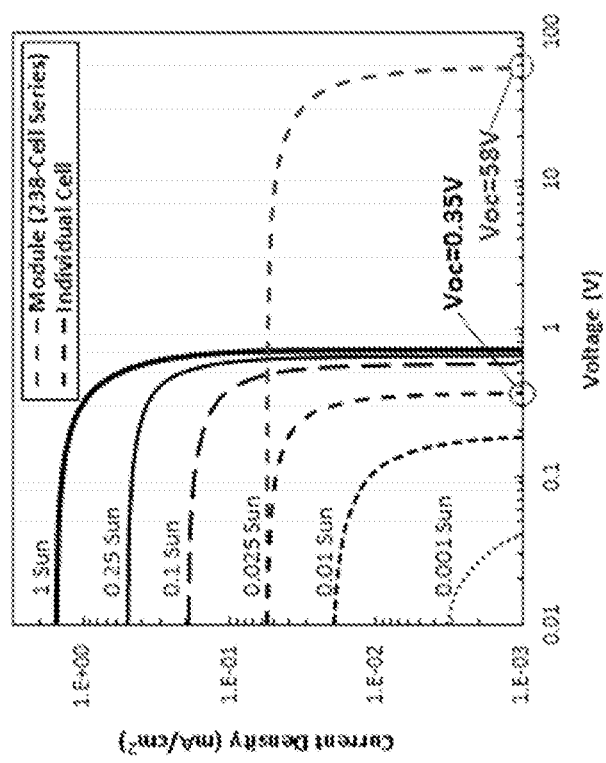
FIG. 15 shows an example total module current-voltage performance.

FIG. 14 is an example embodiment, for purposes of illustration only, of a WPV 1400 that illustrates a device layer overlap pattern including a bottom electrode 1405, active layers 1410 and top electrode 1415. The WPV 1400 is an array module consisting of 238 series-integrated sub-cells. In general, the series-integrated cells will result in an approximate summation of individual cell voltages, while the current will be matched through each of the sub-cells. This is shown in FIG. 15, where a total module current-voltage performance is characterized as well as individual sub-cell performance. At 0.025 Sun intensity, a sub-cell open-circuit voltage of 0.35 V and a total module open-circuit voltage of 58V. Given the expectation of voltage summation, this corresponds to roughly a 70% sub-cell yield across the 140 $cm^2$ module. The current through the sub-cell also matches the current through the full module.

Figures 19A, 19B:
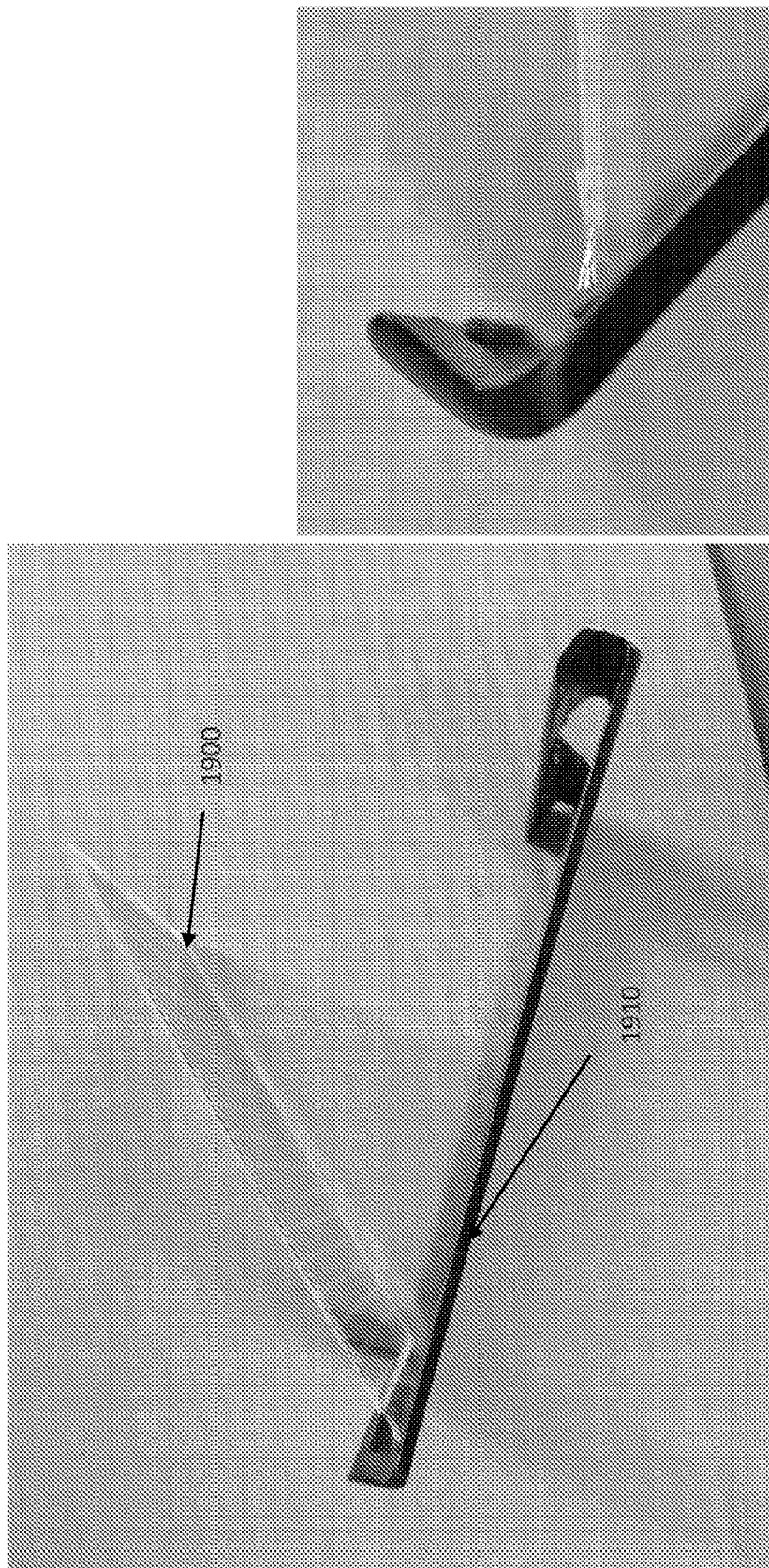
FIGS. 19A and 19B show a WPV module and a case in an elevated state illustrating photovoltaic encapsulation.

FIGS. 18A-18C show example wiring connections in a case 1800 including a WPV module 1805. The WPV module 1805 is encapsulated and/or edge sealed (1810) to a case structure or edge 1815. Electrical wires 1820, which are connected to the WPV module 1805 using solder, conductive adhesive or epoxy (1825) and are passed through the encapsulation or edge seal 1810 and wired to electrical connectors in a bottom housing 1830 via guides 1835. FIGS. 19A and 19B show a WPV module 1900 and a case 1910 in an elevated state illustrating photovoltaic encapsulation.

Figure 20:
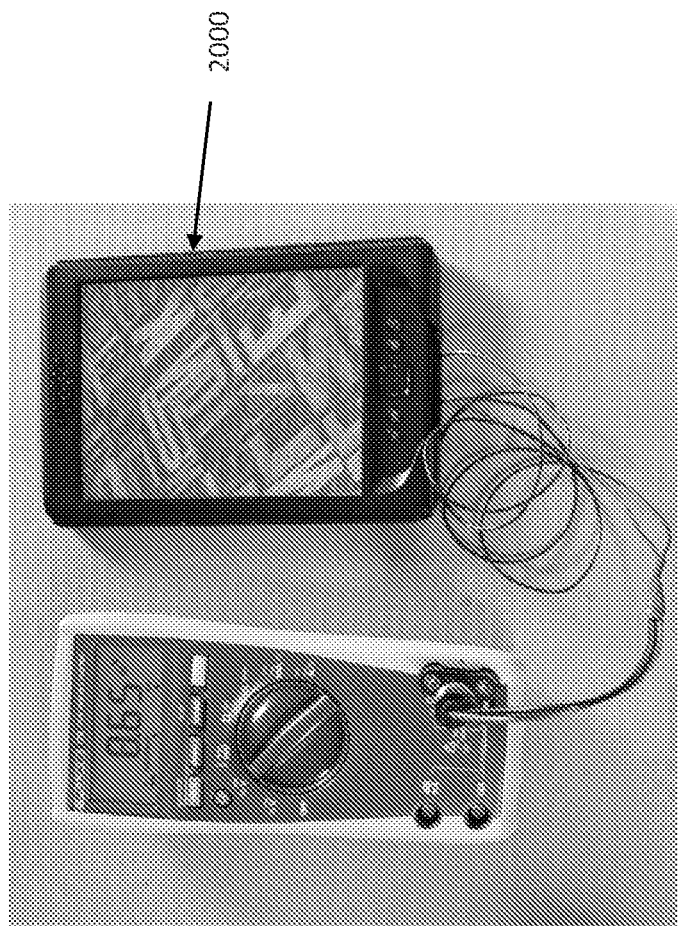
FIG. 20 illustrates the demonstration of power production from a WPV case in ambient light.

FIG. 20 illustrates the demonstration of power production (open-circuit DC voltage) from a WPV case 2000 in ambient light.

FIGS. 21A and 21B show an embodiment of a mobile device 2100 that includes an integrated WPV 2105 in a dissembled state and in an assembled state, respectively. The integrated WPV 2105 may a layer in a display stack or embedded in a display layer in the display stack. The description herein with regard to the WPV incorporated as a case is equally applicable to the integrated embodiment. Implementation of the integrated embodiment uses the techniques described herein in addition to other implementation techniques known to one of ordinary skill in the art and are not described herein.

Figures 22A, 22B, 22C, 22D, 22E:
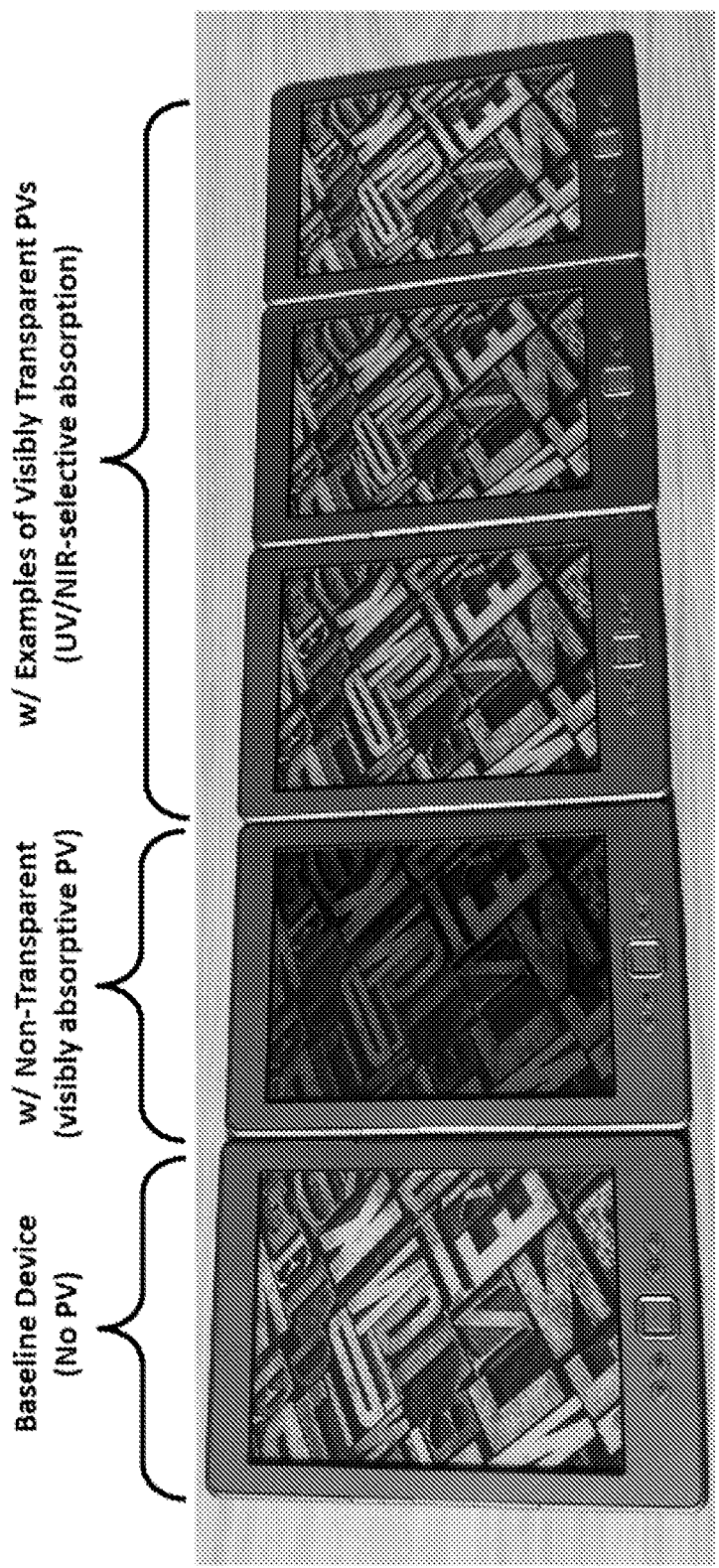
FIGS. 22A-22E showing an example integrated WPV coating within a reflective display.

FIGS. 22A-22E show, for purposes of illustration only, example electronic devices having reflective-type displays (e.g. electrophoretic) with integrated WPV coatings. FIG. 22A is an example baseline electronic device with no PV device attached. FIG. 22B is an example electronic device with a non-transparent or visibly absorptive PV. As shown, there is a visible perceptual difference between FIGS. 22A and 22B. FIGS. 22C-22E show examples of electronic devices with visibly TPVs with UV/NIR-selective absorption at varying degrees. As shown, the perceptual difference is substantially minimized using the wavelength-selective PVs in accordance with the description herein above.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the WPV and any associate electronics described herein, and are considered to be within the full scope of the invention.

Although features and elements are described above in particular combinations, each feature or element can be used alone without the other features and elements or in various combinations with or without other features and elements.

What is claimed is:

1. An apparatus, comprising:
an at least partially visibly transparent photovoltaic module, the at least partially visibly transparent photovoltaic module including one or more at least partially visibly transparent organic photovoltaic cells, wherein each at least partially visibly transparent organic photovoltaic cell is configured in the same way to:
absorb light at a first absorption peak including infrared wavelengths greater than 650 nanometers, wherein a magnitude of the first absorption peak is greater than absorption by the at least partially visibly transparent organic photovoltaic cell at any wavelength between 450 nanometers and 650 nanometers,
transmit visible light at wavelengths corresponding to a plurality of different visible emission or reflections peaks generated by a display of a device, each different visible emission or reflection peak including visible wavelengths between 450 nanometers and 650 nanometers, and
convert absorbed light at the wavelengths corresponding to the first absorption peak into electrical energy, wherein each at least partially visibly transparent organic photovoltaic cell has an area large enough to cover a plurality of different emissive or reflective regions of the display.

2. The apparatus according to claim 1, further comprising: an electronics module connected to the at least partially visibly transparent photovoltaic module to process and feed the electrical energy generated by the one or more at least partially visibly transparent organic photovoltaic cells of the photovoltaic module to the device.

3. The apparatus according to claim 1, wherein each at least partially visibly transparent organic photovoltaic cell is configured to absorb light-incident from external sources.

4. The apparatus according to claim 1, wherein each at least partially visibly transparent photovoltaic cell is further configured in the same way to absorb light at a plurality of visible absorption peaks spectrally positioned between different emission or reflection peaks generated by the display.

5. The apparatus according to claim 1, wherein the at least partially visibly transparent photovoltaic module is a discrete component within a display stack of the display.

6. The apparatus according to claim 5, wherein the at least partially visibly transparent photovoltaic module is index-matched within the display stack.

7. The apparatus according to claim 1, further comprising: an index of refraction matching layer positioned on a back surface of the at least partially visibly transparent photovoltaic module, wherein the index of refraction matching layer is configured to match an index of refraction of the display.

8. The apparatus according to claim 1, further comprising: at least one anti-reflective layer positioned adjacent to the at least partially visibly transparent photovoltaic module.

9. The apparatus according to claim 1, wherein the at least partially visibly transparent photovoltaic module is a coating on a layer in a display stack of the display.

10. The apparatus according to claim 9, wherein the layer in the display stack is index-matched within the display stack.

11. The apparatus according to claim 9, wherein the layer in the display stack is a touch panel.

12. The apparatus according to claim 9, wherein the layer in the display stack is a color filter.

13. The apparatus according to claim 9, wherein the layer in the display stack is the display.

14. The apparatus according to claim 1, wherein the at least partially visibly transparent photovoltaic module is tuned to match different lighting environments.

15. The apparatus according to claim 1, wherein the at least partially visibly transparent photovoltaic module includes a plurality of the at least partially visibly transparent organic photovoltaic cells.

16. A method for providing photovoltaic functionality, comprising:
providing an at least partially visibly transparent photovoltaic module adjacent to a display of a device, wherein the at least partially visibly transparent photovoltaic module includes one or more at least partially visibly transparent organic photovoltaic cells, wherein each at least partially visibly transparent organic photovoltaic cell is configured in the same way to:
absorb light at a first absorption peak including infrared wavelengths greater than 650 nanometers, wherein a magnitude of the first absorption peak is greater than absorption by the at least partially visibly transparent organic photovoltaic cell at any wavelength between 450 nanometers and 650 nanometers, transmit visible light at wavelengths corresponding to a plurality of different visible emission or reflection peaks generated by the display of the device, each different visible emission or reflection peak including visible wavelengths between 450 nanometers and 650 nanometers, and convert absorbed light at wavelengths corresponding to the first absorption peak into electrical energy, wherein each at least partially visibly transparent organic photovoltaic cell has an area large enough to cover a plurality of different emissive or reflective regions of the display; and exposing the at least partially visibly transparent photovoltaic module to light to convert absorbed light at wavelengths corresponding to the first absorption peak into electrical energy.

17. The method according to claim 16, wherein each at least partially visibly transparent organic photovoltaic cell is configured in the same way to absorb light incident from external sources.

18. A method, comprising:

providing an at least partially visibly transparent photovoltaic module including one or more at least partially visibly transparent organic photovoltaic cells, wherein each at least partially visibly transparent organic photovoltaic cell is configured in the same way to:

absorb light at a first absorption peak including infrared wavelengths greater than 650 nanometers, wherein a magnitudes of the first absorption peak is greater than absorption by the at least partially visibly transparent organic photovoltaic cell at any wavelength between 450 nanometers and 650 nanometers, transmit visible light at wavelengths corresponding to a plurality of different visible emission or reflection peaks generated by a display of a device, each different visible emission or reflection peak including visible wavelengths between 450 nanometers and 650 nanometers, and convert absorbed light at wavelengths corresponding to the first absorption peak into electrical energy, wherein each at least partially visibly transparent organic photovoltaic cell has an area large enough to cover a plurality of different emissive or reflective regions of the display;

interfacing the at least partially visibly transparent photovoltaic module with the display; and converting, by the at least partially visibly transparent photovoltaic module, absorbed light at wavelengths corresponding to the first absorption peak into electrical energy.

19. The method according to claim 18, wherein each at least partially visibly transparent organic photovoltaic cell is further configured in the same way to absorb light at a plurality of visible absorption peaks spectrally positioned between different emission or reflection peaks generated by the display.

* * * * *